United States Patent [19]

Tomisawa et al.

[11] Patent Number: 4,986,869
[45] Date of Patent: Jan. 22, 1991

[54] METHOD EMPLOYING INPUT AND OUTPUT STAGING CHAMBER DEVICES FOR REDUCED PRESSURE LAMINATION

[75] Inventors: Yoshiaki Tomisawa; Tadaji Satou; Nobuyuki Hayashi; Yusuke Miyamae, all of Hitachi, Japan

[73] Assignee: Hitachi Chemical Co., Ltd., Tokyo, Japan

[21] Appl. No.: 307,937

[22] Filed: Feb. 9, 1989

Related U.S. Application Data

[62] Division of Ser. No. 899,642, Aug. 25, 1986.

[30] Foreign Application Priority Data

Aug. 30, 1985 [JP] Japan ................... 60-192789

[51] Int. Cl.$^5$ ............................ B32B 31/10
[52] U.S. Cl. .................... 156/250; 156/285; 156/286; 156/382; 156/522
[58] Field of Search ............... 156/285, 286, 381, 382, 156/250, 265, 522, 324; 414/797, 217; 118/719, 733, 715

[56] References Cited

U.S. PATENT DOCUMENTS

| | | | |
|---|---|---|---|
| 4,047,624 | 9/1977 | Dorenbos | 414/217 |
| 4,101,364 | 7/1978 | Tsukada et al. | 156/286 |
| 4,473,922 | 10/1984 | Weiche | 414/797 |

FOREIGN PATENT DOCUMENTS

1119672  6/1986  Japan ........................ 118/719

OTHER PUBLICATIONS

Barber, G. F., "Two-Chamber Air-to-Vacuum Lock System", IBM Technical Disclosure, 12/68, pp. 757-758.

Primary Examiner—Michael W. Ball
Assistant Examiner—Michele K. Yoder
Attorney, Agent, or Firm—Antonelli, Terry, Stout & Kraus

[57] ABSTRACT

In this method for reduced pressure lamination of a light sensitive material in film form to a printed circuit base board, when adhering the light sensitive material in film form comprising a flexible support either continuous or cut to the dimensions of the base board and a light sensitive layer to the printed circuit base board under reduced pressure, a main container for carrying out the adhesion and an intake container and an exit container connected thereto are provided, the base board is supplied to the intake container set to atmospheric pressure, and thereafter the pressure in the intake container is reduced, next the base board is supplied into the main container at reduced pressure and the light sensitive material in film form is adhered to the base board, next the light sensitive material in film form is in the case that it is continuous to the dimensions of the base board, and after supplying the base board to which the light sensitive material in film form has been adhered to the exit container at reduced pressure, the exit container is set to atmospheric pressure and the base board to which the light sensitive material in film form has been ahdered is ejected from the exit container. A reduced pressure adhesion device is also described for performing the method.

5 Claims, 3 Drawing Sheets

METHOD EMPLOYING INPUT AND OUTPUT STAGING CHAMBER DEVICES FOR REDUCED PRESSURE LAMINATION

This is a division of application Ser. No. 899,642, filed Aug. 25, 1986.

BACKGROUND OF THE INVENTION

The present invention relates to a method and a device for performing lamination under reduced pressure conditions, and more particularly relates to such a method and such a device for reduced pressure lamination, in which the feeding in and the feeding out of materials to be laminated, such as for example printed circuit boards and light sensitive material in film form to be adhered thereto, are performed via input and output staging chambers.

There is a per se known type of vacuum or reduced pressure method of lamination for adhering a sheet of light sensitive material in film form to a base board for a printed circuit, said base board having a certain degree of non planarity due to circuit patterns and the like formed thereon, as for instance described in Japanese Patent Publication Ser. No. Sho. 59-3740 (1984), which however it is not hereby intended to admit as prior art to the present patent application except to the extent otherwise required by applicable law. In this disclosure, there is described a method of lamination for a light sensitive material in film form by the application of heat and pressure to a base board by the use of a roller in a reduced pressure environment of ambient pressure not more than 200 mmHg. Furthermore, in Japanese Patent Publication Ser. No. Sho. 53-31670 (1978), there is described a device for reduced pressure lamination of such a base board, which has input and output sealing devices, comprising and employing rollers for carrying out the supply of the base board to be laminated and the taking out of the laminated finished product and for providing seals, such as shown in transverse sectional view in FIG. 5 of the accompanying drawings. In that figure, the reference numerals 1 denote parallel and mutually contacting rollers, constructed to have resilient outer surfaces as by being covered with rubber or the like, which rotate in the directions as shown in the figure by the arrows "b", and which form a mutual gas tight pressure seal by being pressed together as well as forming gas tight pressure seals by being pressed against a wall 3 of a reduced pressure chamber on either side of a slot 3a formed in said wall 3, said slot 3a leading to the interior of said reduced pressure chamber (not otherwise shown). In operation, a base board 2 for lamination is fed in the direction indicated by the arrow "a" in the figure through between said rollers 1 and then through the slot 3a into the interior of the reduced pressure chamber 3 which is being maintained at a pressure substantially lower than atmospheric pressure, while still the gas tight pressure seal provided between said rollers 1 is substantially maintained due to the resilience of the material of said rollers 1.

Yet further, in Japanese Patent Laying Open Publication Ser. No. Sho. 57-4194 (1982), there is described a refinement of the above described device for reduced pressure lamination of such a base board, which has similar input and output sealing devices comprising and employing rollers for carrying out the supply of the base board to be liminated and the taking out of the laminated finished product while maintaining seals, and further comprises sealing strip constructions such as shown in transverse sectional view in FIG. 6 of the accompanying drawings, in which figure reference numerals like to reference numerals in FIG. 5 denote like parts and openings and so on. The difference between the FIG. 6 construction and the FIG. 5 construction is that the rollers 1, although they are similarly constructed to have resilient outer surfaces as by being covered with rubber or the like and similarly still form an mutual gas tight pressure seal by being pressed together, are not pressed against the wall 3 of the reduced pressure chamber, but rather relatively small gaps are left between said rollers 1 and said reduced pressure chamber wall 3. For providing gas tight seals, instead, on either side of the slot 3a formed in said wall 3 and leading to the interior of said reduced pressure chamber, outside the rollers 1, there are provided constructions comprising bases 5, to which sealing strips 4 are retained by being fixed by retaining bars 6 and fixing bolts 7. The sealing strips 4 are pressed against the outer sides of the rollers 1 in the trailing direction with regard to the rotation of said rollers 1 in the directions indicated by the arrows "b", and are sucked inwards by the reduced pressure in the laminating chamber (to the left in the figure of the wall 3), so as to form good and effective seals against the outer sides of said rollers 1. Again, in operation, the base board 2 for lamination is fed in the direction indicated by the arrow "a" in the figure through between said rollers 1 and then through the slot 3a into the interior of the reduced pressure chamber 3 which is being maintained at a pressure substantially lower than atmospheric pressure, while still the gas tight pressure seal provided between said rollers 1 is substantially maintained due to the resilience of the material of said rollers 1, as the base board 2 nevertheless passes between said rollers 1.

These general types of methods and devices are nowadays in wide use in industry, and particularly it is accepted that the laminating method and device described in the above cited Japanese Patent Publication Ser. No. Sho. 59-3740 (1984) are effective for implementation.

However, improvements are still desired in reduced pressure methods and devices for carrying out lamination, such as for example lamination of light sensitive material in thin film form to a base board. The present devices are effectively limited to carrying out adhesion and lamination of a thin film material to a base board of thickness 3.5 mm or less, and to use of a vacuum pressure of 700 mmHg (60 Torr). Recently, however, along with developments in the art of multi layer printed circuit boards, there has appeared a requirement for a reduced pressure laminating and adhering method and device capable of handling base boards of thickness 3.5 mm to 10 mm, and capable of employing higher vacuum pressures.

SUMMARY OF THE INVENTION

Accordingly, it is the primary object of the present invention to provide a method for reduced pressure lamination, which avoids the problems detailed above.

It is a further object of the present invention to provide such a method for reduced pressure lamination, which can satisfactorily handle lamination of materials which are considerably thick.

It is a further object of the present invention to provide such a method for repuced pressure lamination, which can satisfactorily provide lamination in pressure conditions of greater vacuum than has heretofore been practicable.

It is a further object of the present invention to provide such a method for reduced pressure lamination, which is reliable.

It is a further object of the present invention to provide such a method for reduced pressure lamination, which only requires a vacuum pump of moderate capability.

It is a yet further object of the present invention to provide a device for reduced pressure lamination, which implements a method provided so as to satisfy the objects described above, and which likewise aids with the fulfilment of the above objects.

According to the most general method aspect of the present invention, these and other objects are attained by a method for reduced pressure lamination together of a light sensitive material in film form to a printed circuit base board, characterized in that when adhering said light sensitive material in film form comprising a flexible support either continuous or cut to the dimensions of the base board and a light sensitive layer to the printed circuit base board under reduced pressure, a main container for carrying out the adhesion and an intake container and an exit container connected thereto are provided, said base board is supplied to the intake container set to atmospheric pressure, and thereafter the pressure in the intake container is reduced, next said base board is supplied into the main container at reduced pressure and the light sensitive material in film form is adhered to said base board, next said light sensitive material in film form is in the case that it is continuous cut to the dimensions of the base board, and after supplying the base board to which said light sensitive material in film form has been adhered to the exit container at reduced pressure, the exit container is set to atmospheric pressure and the base board to which said light sensitive material in film form has been adhered is ejected from the exit container; and, according to the most general device aspect of the present invention, these and other objects are attained by a reduced pressure adhesion device, comprising a main container for adhering a light sensitive material in film form comprising a flexible support either continuous or cut to the dimensions of a printed circuit base board and a light sensitive layer to said printed circuit base board under reduced pressure, an intake container connected thereto capable of reduced pressure for supplying said base board to the main container, a mechanism cutting said light sensitive material in film form to the dimensions of the base board in the case that it is continuous, and an exit container connected to the main container capable of reduced pressure for extracting said base board to which said light sensitive material in film form has been adhered from the main container, and such that after said base board is supplied to the intake container set to atmospheric pressure the pressure in the intake container is reduced, said base board is supplied into the main container at reduced pressure, after a light sensitive material in film form is adhered to said base board in the main container, said light sensitive material in film form is cut to the dimensions of the base board in the case that it is continuous, supply to the exit container at reduced pressure is carried out, next the exit container is set to atmospheric pressure and the base board to which said light sensitive material in film form has been adhered is ejected form the exit container.

BRIEF DESCRIPTION OF THE DRAWINGS

The present invention will now be described with respect to the preferred embodiments of the method and the device thereof, and with reference to the illustrative drawings appended hereto, which however are provided for the purposes of explanation and exemplification only, and are not intended to be limitative of the scope of the present invention in any way, since this scope is to be delimited solely by the accompanying claims. With relation to the figures, spatial terms are to be understood as referring only to the orientation on the drawing paper of the illustrations of the relevant parts, unless otherwise specified; like reference numerals, unless otherwise so specified denote the same parts and gaps and spaces and so on in the various figures relating to one preferred embodiment, and like parts the gaps and spaces and so in figures relating to different preferred embodiments; and:

DESCRIPTION OF THE PREFERRED EMBODIMENTS

Figure 1:
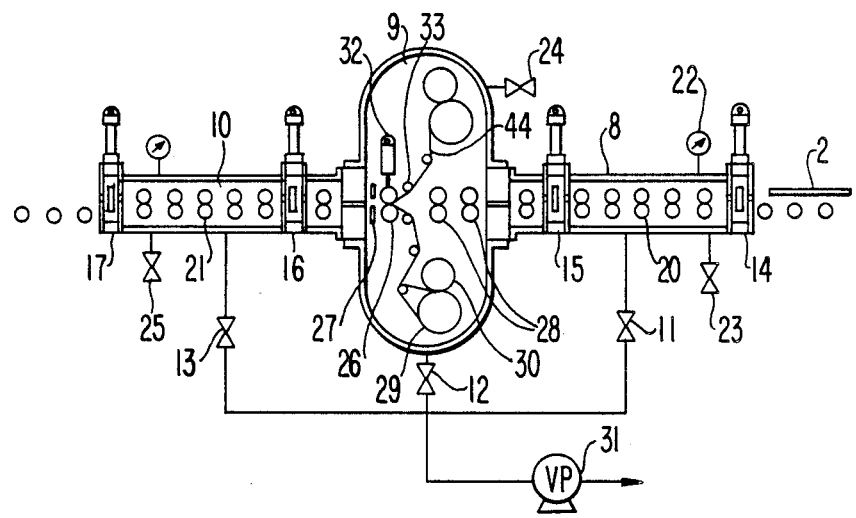
FIG. 1 is a schematic longitudinal sectional view showing the first preferred embodiment of the reduced pressure laminating device according to the present invention, which practices the first method embodiment.

The present invention, in its method and device aspects, will now be described with reference to the preferred embodiments of the method and the device thereof, and with reference to the figures. FIG. 1 is a schematic longitudinal sectional view showing the first preferred embodiment of the reduced pressure laminating according to the present invention, for practicing the first method embodiment. In this figure, the reference numeral 2 denotes a board such as a printed circuit base board, which is to be laminated by this apparatus together with a light sensitive thin film material, and which is fed through, in turn, an input staging chamber device 8, a main lamination chamber device 9, and an output staging chamber device 10. These input and output staging chamber devices 8 and 10 function as air locks for maintaining the reduced pressure in the main lamination chamber device 9 at an acceptable low level without any requirement for heavy duty operation of a vacuum pump.

In detail, in a first process stage, as the board 2 is fed in the leftwards direction as seen in the figure from the position shown therein, an input staging chamber device input gate valve 14 leading into the input staging chamber device 8 is opened, while an input staging chamber device output gate valve 15 leading out from said input staging chamber device 8 into the main lamination chamber device 9 is closed; and, furthermore, an input staging chamber device bleed valve 23 is opened, while an input staging chamber device evacuation valve 11 is closed. Thus, the board 2 is passed through the input staging chamber device input gate valve 14 and is received into the internal cavity of the input staging chamber device 8. The gate valves such as the input staging chamber device input gate valve 14 and the input staging chamber device output gate valve 15 may be of a type described hereinafter, as may other gate valves which will be described shortly. In this first preferred embodiment of the method and device of the present invention, the board 2 is supplied individually; in other words boards are not taken in to the device in plurality as is the case with the second preferred method and device embodiments to be described subsequently.

Next, in a second process stage, the input staging chamber device input gate valve 14 is closed, while the input staging chamber device output gate valve 15 leading out from said input staging chamber device 8 into the main lamination chamber device 9 is maintained as closed; and now the input staging chamber device bleed valve 23 is closed, while the input staging chamber device evacuation valve 11 is opened and also a vacuum pump 31 is operated. Thus, the internal cavity of the input staging chamber device 8 holding the board 2 in it is isolated from the ambient atmosphere and also from the main lamination chamber device 9, while the vacuum pump 31, via a conduit system not denoted by any reference numeral, sucks out the atmospheric air within said internal cavity of said input staging chamber device 8, thus to bring the pressure in said internal cavity and surrounding the base board 2 down to an appropriate reduced pressure for performing lamination. During this air sucking out process, the pressure in the input staging chamber device 8 is monitored by the use of a per se conventional pressure metering device 22 which has contacts which close at a determinate pressure level, or the like.

Next, in a third process stage, when the pressure in said internal cavity of said input staging chamber device 8 has been brought down to be substantially equal to the reduced pressure in the internal cavity of the main lamination chamber device 9 which is an appropriate reduced pressure for performing lamination, the input staging chamber device input gate valve 14 is maintained as closed, while the input staging chamber device output gate valve 15 leading out from said input staging chamber device 8 into the main lamination chamber device 9 is now opened; and further the input staging chamber device bleed valve 23 is maintained as closed, while the input staging chamber device evacuation valve 11 is now closed and the vacuum pump 31 may be ceased to be operated. Thus, the internal cavity of the input staging chamber device 8 holding the board 2 in it is communicated to the main lamination chamber device 9 through said input staging chamber device output gate valve 15.

Next, in a fourth process stage, the board 2 is forwarded by a plurality of transport rollers 20 from the internal cavity of the input staging chamber device 8 through the input staging chamber device output gate valve 15 into the main lamination chamber device 9. As this occurs, the board 2 is preheated by heater rollers 28 in said main lamination chamber device 9, in between which rollers 28 said board 2 passes.

Next, in a fifth process stage, the board 2, in the internal cavity of the main lamination chamber device 9, is forwarded in between laiminating rollers 26, and is laminated to a sheet 44 of thin film light sensitive material (or the like), which is transported while being preheated by a heating shoe 33 from a protection film winding shaft 30, with the aid of a light sensitive material extraction roller 29. The reference numeral 32 denotes a pressure cylinder for pressing the two laminating rollers 26 together. And, as the board 2 laminated with the light sensitive film material is further transported, said light sensitive film material is cut by a cutter 27.

Meanwhile, the input staging chamber device output gate valve 15 is now closed, so as to isolate the input staging chamber device 8 from the main lamination chamber device 9. After this, concurrently with the remaining process steps for the laminated board, the input staging chamber device bleed valve 23 is opened so as gradually to leak air from the ambient atmosphere into said input staging chamber device 8, so as to progressively bring its internal pressure up to atmospheric. When this pressure rise has been completed, the input staging chamber device input gate valve 14 may be opened, to repeat the cycle of inputting for the next printed circuit board 2 to be laminated, as described above, while the input staging chamber device output gate valve 15 is maintained as closed.

Next, in a sixth process stage, with the pressure in the internal cavity of the output staging chamber device 10 being substantially equal to the reduced pressure in the internal cavity of the main lamination chamber device 9, and with an output staging chamber device output gate valve 17 being maintained as closed, an output staging chamber device input gate valve 16 leading out from the main lamination chamber device 9 into said output staging chamber device 10 is now opened; and further an output staging chamber device bleed valve 25 is maintained as closed, while also an output staging chamber device evacuation valve 13 is kept open. Thus, the internal cavity of the main lamination chamber device 9 holding the board 2 in it is communicated to the output staging chamber device 10 through said output staging chamber device input gate valve 16.

Next, in a seventh process stage, the printed circuit board 2 now laminated with the thin light sensitive film material is forwarded by a plurality of transport rollers 21 from the internal cavity of the main lamination chamber device 9 into the output staging chamber device 10 through said output staging chamber device input gate valve 16. Again, according to this preferred embodiment, this taking out of the laminated printed circuit board 2 is performed one board at a time. When the length of the printed circuit board 2 is less than the distance between the cutter 27 and the output staging chamber device input gate valve 16, then the thin pressure sensitive film may be cut by said cutter 27 before said output staging chamber device input gate valve 16 is opened; otherwise, it will be necessary to cut the thin pressure sensitive film by said cutter 27 while the printed circuit board 2 with the film laminated thereto is being pressed through the opened output staging chamber device input gate valve 16.

Next, in an eighth process stage, the output staging chamber device input gate valve 16 is now closed, so as to isolate the output staging chamber device 10 from the main lamination chamber device 9. After this, the output staging chamber device bleed valve 25 is opened so as gradually to leak air from the ambient atmosphere into said output staging chamber device 10, so as to progressively bring its internal pressure up to atmospheric. At this time, the output staging chamber device bleed valve 25 is maintained as closed. When this pressure rise has been completed, the output staging chamber device output gate valve 17 is opened.

Next, in a ninth process stage, the board 2 is further fed by the rollers 21 in the leftwards direction as seen in the figure, through the opened output staging chamber device output gate valve 17 to the outside, while the output staging chamber device input gate valve 16 leading out from the main lamination chamber devive 9 into said output staging chamber device 10 is kept closed; and, furthermore, the output staging chamber device evacuation valve 13 is kept closed. Thus, the board 2 is passed from the internal cavity of the outpout staging chamber device 10 through the output staging chamber device output gate valve 17 to the outside for further processing.

Next, in a final tenth process stage, the output staging chamber device output gate valve 17 is closed, while the output staging chamber device input gate valve 16 leading in to said output staging chamber device 10 from the main lamination chamber device 9 is maintained as similarly closed; and now the output staging chamber device bleed valve 25 is closed, while the output staging chamber device evacuation valve 13 is opened and also the vacuum pump 31 is operated. Thus, the internal cavity of the output staging chamber device 10 (which is currently empty) is isolated from the ambient atmosphere and also from the main lamination chamber device 9, while the vacuum pump 31, via the conduit system not denoted by any reference numeral, sucks out the atmospheric air within said internal cavity of said output staging chamber device 10, thus to bring the pressure in said internal cavity down to be susbtantially equal to the appropriate reduced pressure for performing lamination within the main lamination chamber device 9. During this air sucking out process, the pressure in said output staging chamber device 10 is monitored by the use of a per se conventional pressure metering device, not denoted by any reference numeral but similar to the device 22 on the input side, which similarly has contacts which close at a determinate pressure level or the like. And then this output staging chamber device 10 is ready for the next cycle of receiving a printed circuit board 2 with laminated light sensitive film thereon and transferring it to the outside.

Now, during the performance of this process of reduced pressure lamination as described above, preferably the spacings between the transport rollers 20 of the input staging chamber device 8, the preheating rollers 28 and the laminating rollers 26 of the main lamination chamber device 9, and the transport rollers 21 of the output staging chamber device 10, are adjusted beforehand according to the thickness of the base board 2. The spacing of these rollers is preferably adjusted to be about 1.6 mm greater than the thickness of the board 2.

The reference numeral 12 denotes a main chamber evacuation valve. When this main chamber evacuation valve 12 is closed as is normally the case, vacuum (pressure depression) within the main lamination chamber device 9 is held therein and maintained. However, should it become necessary to evacuate further said main lamination chamber device 9, i.e. to drop the pressure therein, and of course when initially evacuating said main lamination chamber device 9, this main chamber evacuation valve 12 is opened, and simultaneously the vacuum pump 31 is operated, thus pumping air out of said main lamination chamber device 9 and reducing the pressure therein to an acceptable pressure level for lamination.

Now, referring to FIG. 2, the second preferred embodiment of the reduced pressure laminating device according to the present invention, for practicing the second method embodiment, will be described. In this figure, reference numerals corresponding to reference numerals in FIG. 1 denote like parts.

In this second preferred embodiment, the input staging chamber device 8 and the output staging chamber device 10 are constructed to incorporate stocker devices 18 and 19. The stocker device 18 receives the base boards to be laminated and automatically supplies them one by one into the main lamination chamber device 9, for lamination therein. And the other stocker device 19 receives the base boards which have been laminated with light sensitive film. These stocker devices 18 and 19 are opening and closing door constructions respectively for inserting and taking out the boards.

Figure 2:
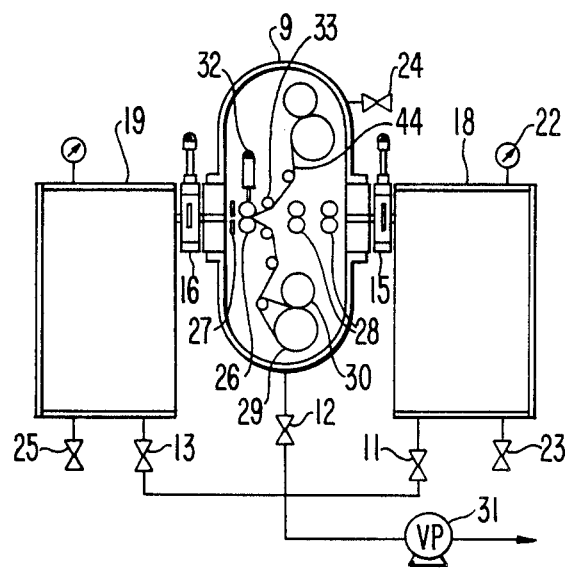
FIG. 2 is a schematic longitudinal sectional view showing the second preferred embodiment of the reduced pressure laminating device according to the present invention, said second preferred device embodiment incorporating input and output stocking devices and practicing the second preferred method embodiment.
Figure 3:
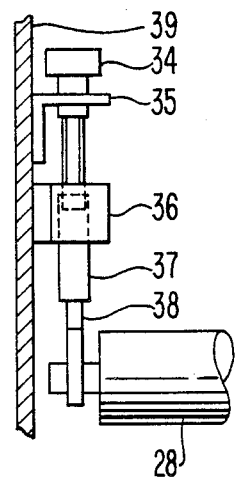
FIG. 3 is a partial side view showing an example of a mechanism for adjusting the spacing of certain base board preheating rollers in a main lamination chamber device of the first and second preferred embodiment devices of FIGS. 1 and 2.

FIG. 3 shows an example of a mechanism for adjusting the spacing of the base board preheating rollers 28 in the main lamination chamber device 9 of the first and second preferred embodiment devices shown in FIGS. 1 and 2. The reference numeral 34 denotes a spacing adjustment knob, while 35 is a fitting for it, 36 is a bearing, 37 is a slide shaft, 38 is a roller support, and 39 is a main container frame. By turning the spacing adjustment knob 34, the base board preheating roller 28 can be moved up and down at will, and the spacing between the rollers 28 can be set arbitrarily. The operation of this device will be clear to one of ordinary skill in the mechanical art without further explanation, in the light of this disclosure.

The lamination and adhesion within the main lamination chamber device 9 may be carried out by using a hot roller lines with a heat resistant rubber or rubber like material capable of being heated up to approximately 100° C. by the use of a sheath heater or the like without damage. Alternatively, in the case of a construction provided with a heat shoe for preheating the light sensitive material in film form, the method of carrying out lamination and adhesion with a rubber lined cold roller is also acceptable. However, it is preferable for a method to be practiced whereby the lamination and adhesion pressure between the laminating rollers 26 is only their own weight when the base board 2 to be laminated is not inserted between said rollers 26, and that when the base board 2 to be laminated is present between said rollers 26 pressure is applied by the use of a hydraulic or air cylinder or the like.

Figure 4A:
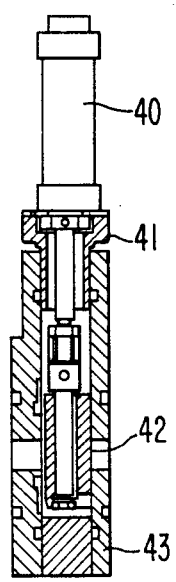
FIG. 4 shows in its two views a sectional view and a partial front elevation of a type of gate valve that may be used in said first and second preferred embodiment devices of FIGS. 1 and 2.
Figure 4B:
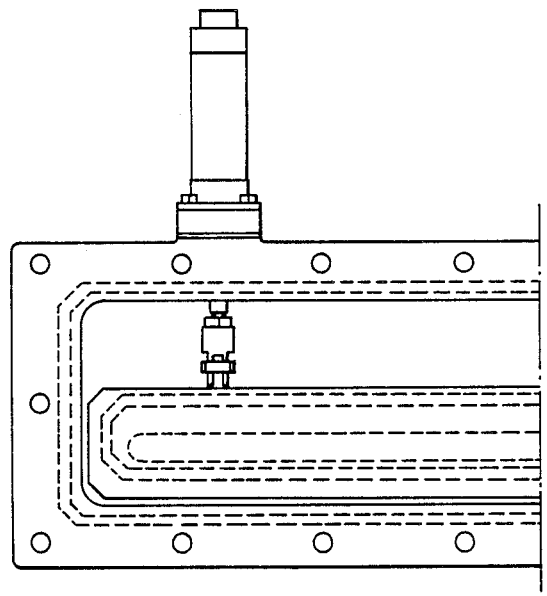
Figure 5:
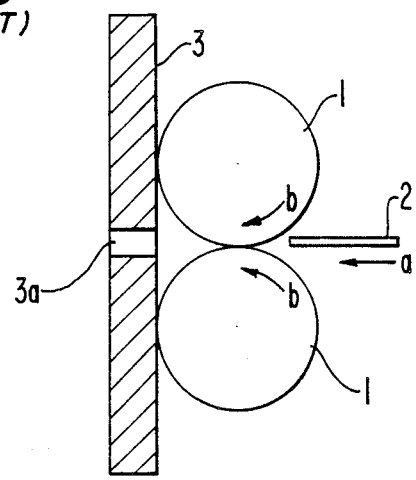
FIG. 5 is a transverse sectional view of a roller type sealing construction for a reduced pressure laminating device, according to one prior art.
Figure 6:
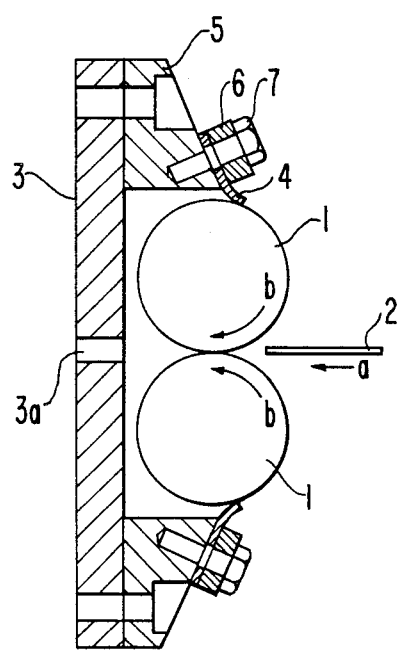
FIG. 6, similarly to FIG. 5, is a transverse sectional view of a roller type sealing construction for a reduced pressure laminating device, further employing strip type sealing constructions, as according to another prior art.

The gate valves utilized in the device of the present invention may be conventional seal roller constructions such as those disclosed in the preamble to this specification, or may be of the type shown in detail in FIGS. 4a and 4b. FIG. 4a is a transverse sectional view of such a gate valve, while FIG. 4b is a partial front elevation thereof. In these figures, the reference numeral 40 denotes an air cylinder for raising and lowering gate denoted by 42, and 41 is a frame for the gate valve, while 43 is a seal plate.

In FIGS. 1 and 2 there are shown devices including cutters for the film after it has been adhered to the printed circuit base board 2, but this is not to be considered as limitative of the present invention; it is alternatively possible for the film to be cut to the dimensions of the printed circuit board 2 and then subsequently to be stuck on to said printed circuit board 2 in the main lamination chamber device 9 without being further cut. Such a structure is, for example, disclosed in Japanese Patent Laying Open Publication Serial No. 59-105256 (1984). In this publication, there is disclosed a mechanism whereby the film is cut to the dimensions of the printed circuit board and then is laminated and adhered to said printed circuit board. In this device, the adhesion is performed vertically, but when using the present invention with this mechanism being incorporated, it is preferable for the intake and exit container to be above and below the main container respectively.

Instead of cutting the film either before or after laminating it to the printed circuit board, it is alternatively possible to use precut film. In such a case, the precut film may be stored permanently inside the main container, or alternatively it may be supplied along with the printed circuit boards through the intake container. The film may not necessarily be cut to exactly the same size as the printed circuit board; generally, in fact, the film is cut to be slightly smaller than the printed circuit board, but alternatively it could be larger.

In the devices shown in FIGS. 1 and 2 the film further has a protective film, but this is not necessary to the present invention, and in such a case the protective film winding roller or rollers 30 could be omitted.

There is no particular limitation on the film for being used with the present invention, but for example the film described in Japanese Patent Publication Serial No. 45-25231 (1970) may be advantageously used.

The benefit of the present invention is that, according to the method and the device thereof, it is possible to satisfactorily perform adhesion of a light sensitive film material under reduced pressure conditions to a base board of thickness 3.5 to 10 mm, which as explained above is a substantially thicker type of base board than could conveniently be handled by prior art laminating methods and devices. During such adhesion and lamination according to the present invention, there is no substantial risk of generation of air bubbles or wrinkles or the like. Furthermore, a higher vacuum value than available by the prior art can be utilized, for example a vacuum of 730 mmHg or 30 Torr.

Also, since the raising and lowering of pressure for taking in and taking out board which are to be, and have been, laminated with film are not required to be performed for the whole machine, but rather only for the input and the output containers, thus as compared with a conventional case the exhaustion of air and replenishment or bleeding of air can be done more smoothly, and it is possible for the device to be operated with a lower power type vacuum pump than has heretofore been the case.

PRACTICAL EXAMPLE

Using the device according to the first preferred embodiment of the present invention shown in FIG. 1, incorporating a vacuum pump of capacity about 3000 liters per minute, about 50 mm diameter laminating rollers, and an about 4 kgf/cm$^2$ air cylinder for said laminating rollers, and using a temperature of about 110° C. for the shoe for preheating the light sensitive film material, a base printed circuit board, about 8 mm in thickness (with printed circuit thickness about 75 microns) and about 330 mm by about 500 mm is size, was, at a feed speed of about 2 meters per minute, laminated and adhered to a light sensitive film material, so called Photek PHT-SR-1000N-75 (product name, manufactured by Hitachi Kasei Kogyo KK), with the intake container vacuum about 730 mmHg and with the intake container gate valve open. It was possible for the adhesion to be carried out in a high vacuum state of about 750 mmHg (10 Torr), and for each board in about 1.5 minutes a satisfactory lamination process was performed without the generation of air bubbles or wrinkles or the like, and the Photek PHT-SR-1000N-75 film material was satisfactorily adhered to the base board.

Although the preset invention has been shown and described in terms of the preferred embodiments of the method and the device thereof, and with reference to the appended drawings, it should not be considered as being particularly limited therbey, since the details of any particular embodiment, or of the drawings, could be varied without, in many cases, departing from the ambit of the present invention. Accordingly, the scope of the present invention is to be considered as being delimited, not by any particular perhaps entirely fortuitous details of the disclosed preferred embodiments, or of the drawings, but solely by the scope of the accompanying claims, which follow.

What is claimed is:

1. A method of laminating a light senstive material in a film form and a printed circuit base board together under vacuum in an evacuated first chamber space of a reduced pressure adhesion device which further comprises a second chamber space adapted to be selectively connected to or disconnected from said first chamber space on a first side thereof by a first gate valve and a third chamber spaced adapted to be connected to or disconnected from said first chamber space on a second side thereof substantially opposite to said first side by a second gate valve, comprising the steps of:

charging said printed cirucit base board into said second chamber space under atmospheric pressure while said second chamber space is disconnected from said first chamber space by said first gate valve;

evacuating said second chamber space to be substantially in a same evacuated condition as said first chamber space;

connecting said second chamber space to said first chamber space by opening said first gate valve;

transferrng said printed circuit base board from said second chamber space to said first chamber space;

continuing transfer of said printed circuit base board in said first chamber space while preheating said printed circuit base board and laminating said light sensitive material which is supplied from a continuous source thereof provided in said first chamber space onto said printed circuit base board under application of a force for pressing said light sensitive material and said printed circuit base board to one another to form a tightly laminated material of said light sensitive material and said printed circuit base board;

evacuating said third chamber space to be substantially in a same evacuated condition as said first chamber space;
connecting said third chamber space to said first chamber space by opening said second gate valve;
transferring said laminated material from said first chamber space to said third chmaber space while cuting said light sensitive material laminated on said printed circuit base board off from a remaining continuous source thereof;
disconnecting said third chamber space from said first chamber space by said second gate valve;
removing the evacuated condition of said third chamber space; and
discharging said laminated material from said third chamber space under atmospheric pressure.

2. A method according to claim 1, wherein said second chamber space is evacuated from an atmospheric condition each time when each printed circuit base board is charged into said second chamber space.

3. A method according to claim 1, wherein the evacuated condition of said third chamber space is removed each time when each laminated material is discharged from said third chamber space.

4. A method according to claim 1, wherein said second chamber space is evacuated from an atmospheric condition once for a plurality of said prinyted circuit base boards being charged into said second chamber space as a stock.

5. A method according to claim 1, wherein the evacuated condition of said third chamber space is removed once for a plurality of said laminated materials accumulated in said third chamber space being discharged therefrom.

* * * * *